United States Patent
Li

(10) Patent No.: US 8,131,047 B2
(45) Date of Patent: Mar. 6, 2012

(54) METHOD AND DEVICE FOR DISTORTION CORRECTION IN MAGNETIC RESONANCE IMAGING

(75) Inventor: Guo Bin Li, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 574 days.

(21) Appl. No.: 12/344,900

(22) Filed: Dec. 29, 2008

(65) Prior Publication Data

US 2009/0169083 A1    Jul. 2, 2009

(30) Foreign Application Priority Data

Dec. 29, 2007  (CN) .......................... 2007 1 0301666

(51) Int. Cl.
*G06K 9/00* (2006.01)
(52) U.S. Cl. ........................................ 382/131; 382/128
(58) Field of Classification Search ........... 382/128–134
See application file for complete search history.

(56) References Cited

U.S. PATENT DOCUMENTS

| 2008/0157767 A1 | 7/2008 | Bammer et al. |
| 2009/0195247 A1* | 8/2009 | Pfeuffer et al. ............... 324/307 |

* cited by examiner

*Primary Examiner* — David Mis
(74) *Attorney, Agent, or Firm* — Schiff Hardin LLP

(57) ABSTRACT

In a method and device for correcting distortion in MRI, k-space data are acquired in a number of data readout directions, the data are converted into a number of images, and a corresponding pixel shift map is generated for each image. The geometric distortion in the corresponding image is corrected according to the pixel shift map, and then all geometric distortion-corrected images are combined. Since movement distortion normally exists in the data readout direction, collecting the k-space data from a number of data readout directions can effectively correct movement distortion. Moreover, correcting the geometric distortion for the images converted from data acquired in a number of data readout directions according to the pixel shift map can reduce the geometric distortion of the final image generated from combination of images. The method and device correct not only movement distortion of MRI images, but also geometric distortion of MRI images.

14 Claims, 8 Drawing Sheets

FIG. 4
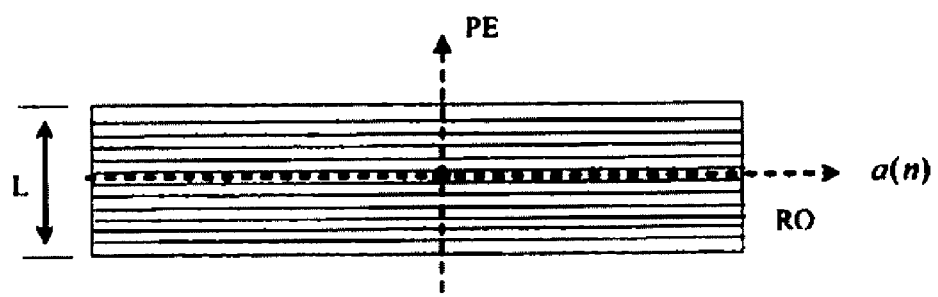
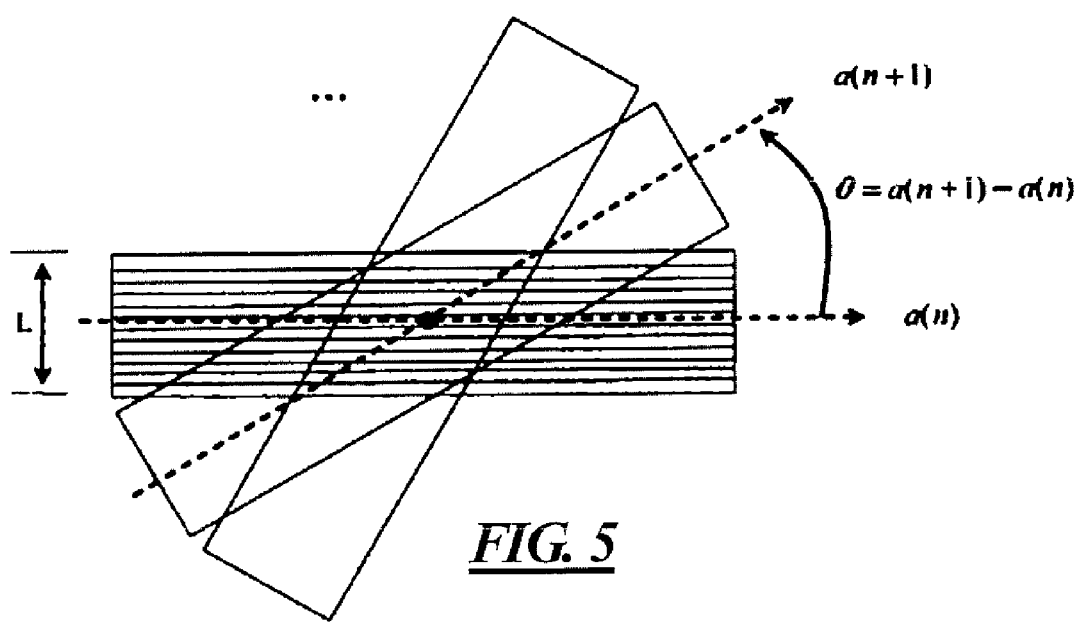
FIG. 5

FIG. 6

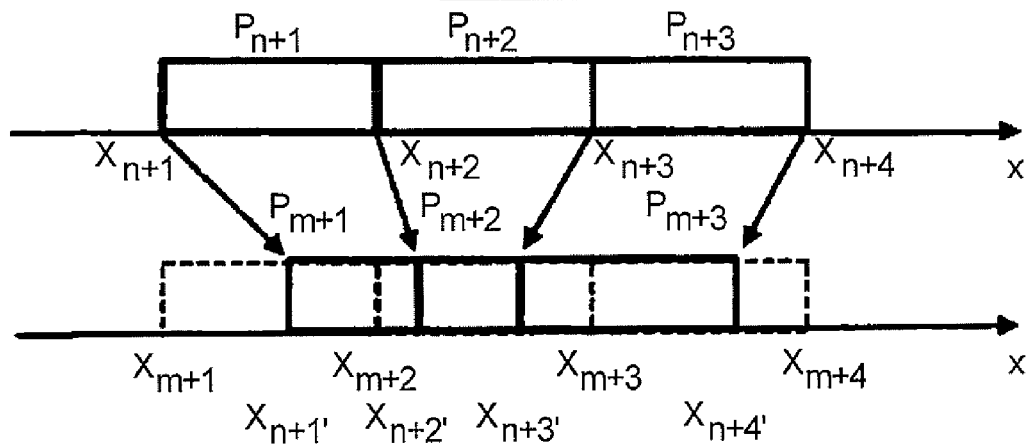

FIG. 7

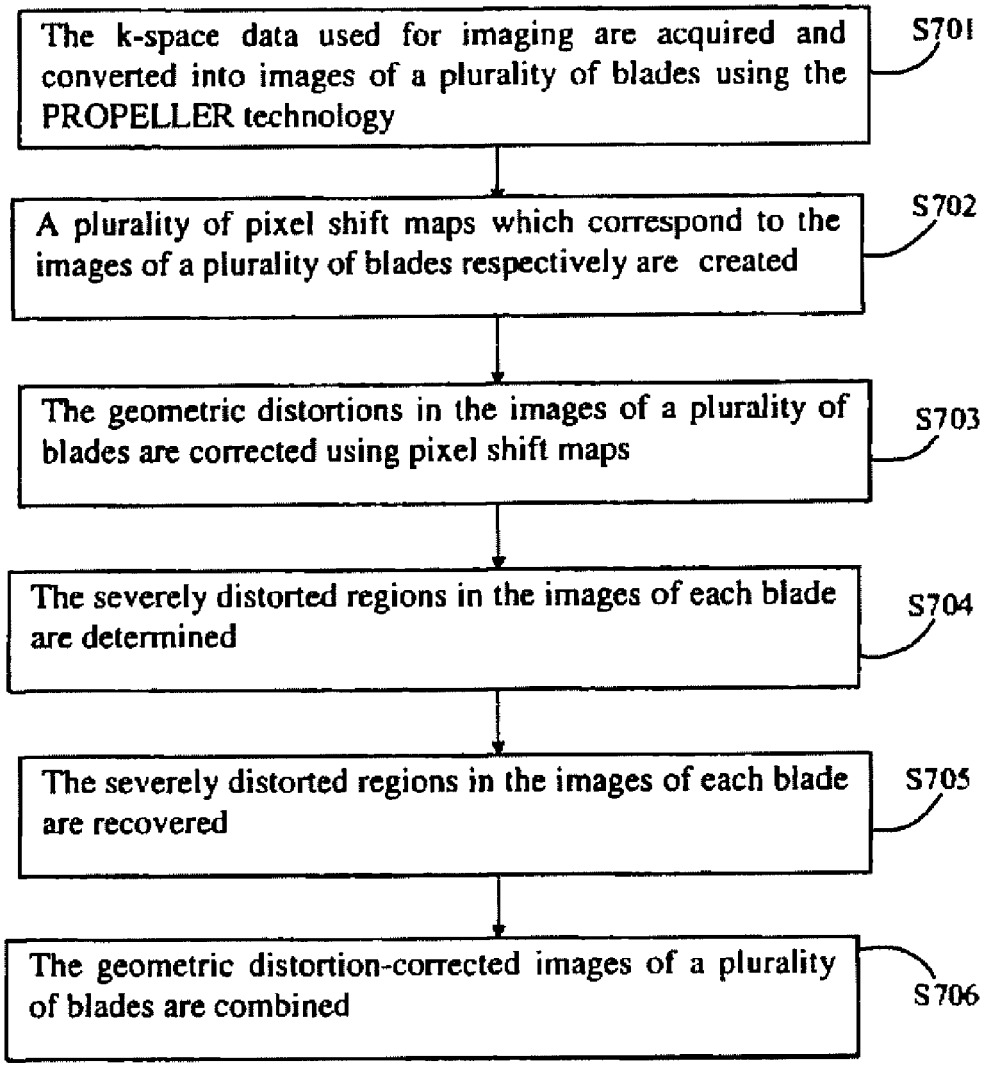

| Step | Description |
|---|---|
| S701 | The k-space data used for imaging are acquired and converted into images of a plurality of blades using the PROPELLER technology |
| S702 | A plurality of pixel shift maps which correspond to the images of a plurality of blades respectively are created |
| S703 | The geometric distortions in the images of a plurality of blades are corrected using pixel shift maps |
| S704 | The severely distorted regions in the images of each blade are determined |
| S705 | The severely distorted regions in the images of each blade are recovered |
| S706 | The geometric distortion-corrected images of a plurality of blades are combined |

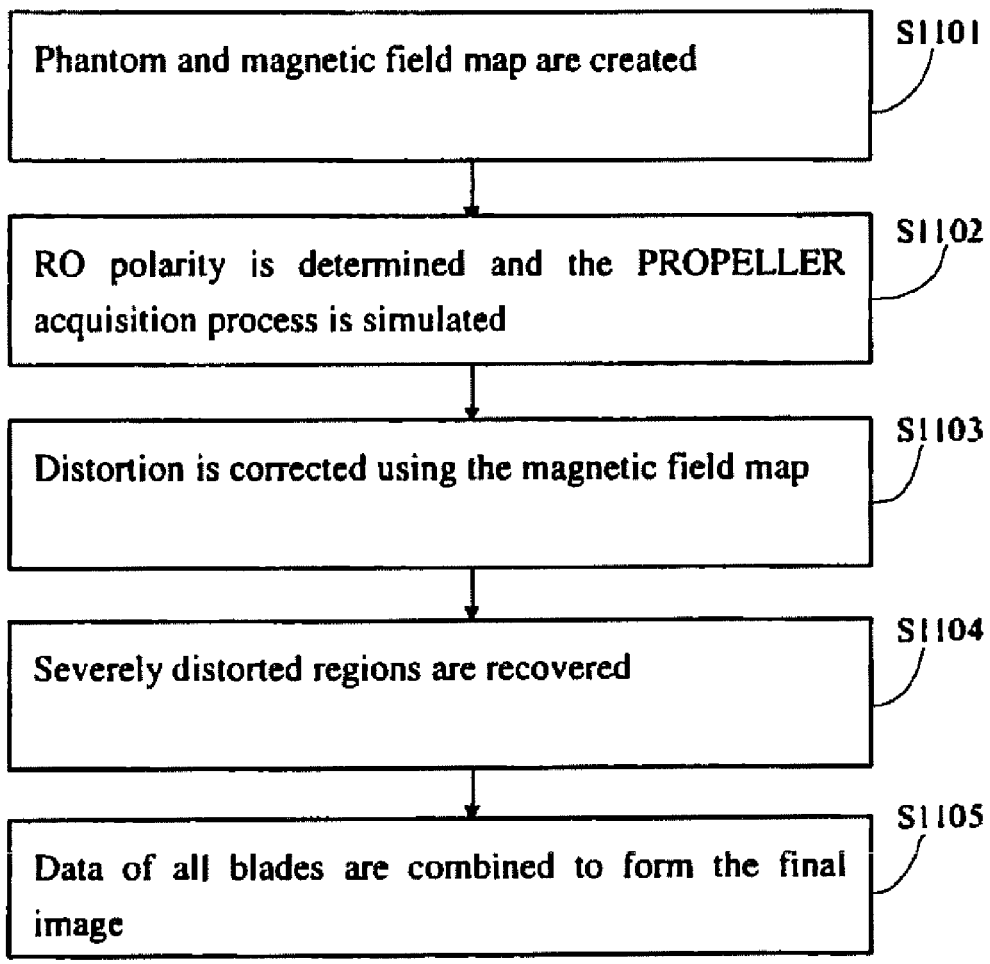
*FIG. 11*
S1101 Phantom and magnetic field map are created
S1102 RO polarity is determined and the PROPELLER acquisition process is simulated
S1103 Distortion is corrected using the magnetic field map
S1104 Severely distorted regions are recovered
S1105 Data of all blades are combined to form the final image
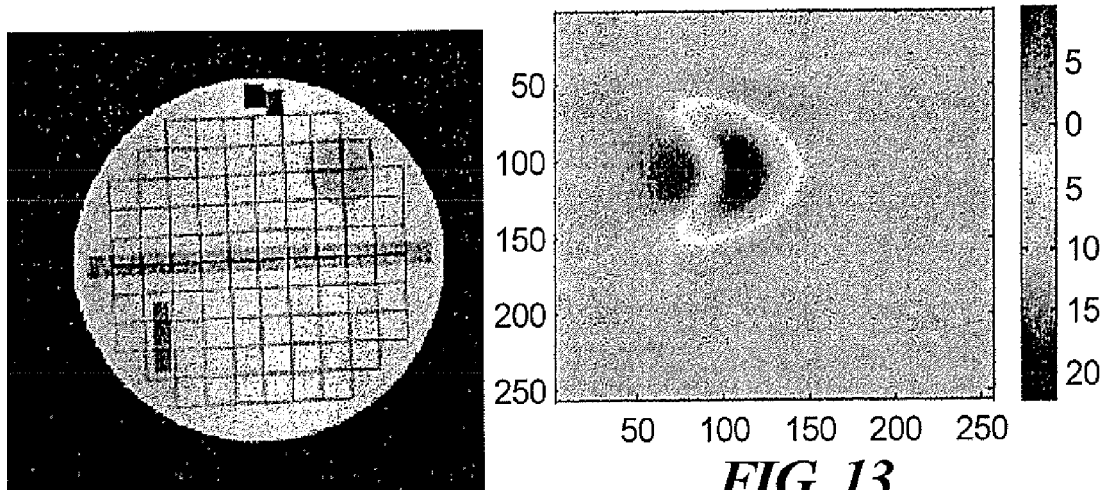
*FIG. 12*
*FIG. 13*

METHOD AND DEVICE FOR DISTORTION CORRECTION IN MAGNETIC RESONANCE IMAGING

BACKGROUND OF THE INVENTION

1. Field of the Invention

The present invention relates to magnetic resonance imaging (MRI) technology, and more particularly, to a method and device for correcting distortion in MRI.

2. Description of the Prior Art

Due to the influence of various factors, distortion occurs in the MRI process. By their sources, the distortions which are normally found in MRI can principally be divided into magnetic field related distortion and human body related distortion.

The magnetic field related distortion is mainly attributable to the inhomogeneous magnetic field, especially the geometric distortion induced by inhomogeneity of the primary magnetic field. In the case of a highly inhomogeneous magnetic field existing, many signals may overlap to create geometric distortion. Many factors may cause inhomogeneity of a magnetic field, such as implanted metal devices and metal fixture is in the body of the patient.

Human body related distortions mainly include movement distortion, which is generated due the reason that the patient may lose patience and move his body during the prolonged MRI scanning process. Movement artifact is especially evident among very young or restless patients. If the movement artifact is very serious, the image quality will be inferior and causes adverse effects on diagnosis.

At present, the Periodically Rotated Overlapping ParallEL Lines Enhanced Reconstruction (PROPELLER) technology is widely used for movement correction where radial blades acquire data in a spiral fashion and guide the filling of the whole k-space with data in a unique k-space filling mode. This technology can eliminate movement artifact in the most complicated and difficult conditions to acquire images of excellent quality. The k-space is also referred to as frequency space, the x-coordinate and y-coordinate of which respectively refers to the frequency change in the phase encoding direction and frequency encoding direction.

Although PROPELLER technology can effectively correct the movement distortion, it can not correct the geometric distortion caused by inhomogeneity of the magnetic field or specific magnetization.

SUMMARY OF THE INVENTION

One purpose of the present invention is to provide a method for correcting distortion in MRI which is able to effectively correct movement distortion and geometric distortion in MRI.

Another purpose of the present invention is to provide a device corresponding to the aforesaid method for correcting distortion in MRI.

In order to achieve the aforesaid purposes, the present invention provides a method for correcting distortion in MRI, including the steps of acquiring k-space data in a number of data readout directions, and converting the data into a number of images, creating a corresponding pixel shift map for each of those images, correcting the geometric distortion in the corresponding images according to the pixel shift map, and combining all the geometric distortion-corrected images.

In an embodiment, the geometric distortion correction of the corresponding images according to the pixel shift map can be done by calculating the shift position of every pixel in the corresponding images according to the pixel shift map, and calculating the pixel value of the geometric distortion-corrected images according to the shift position and the pixel value in the shift position.

The method can further include the steps of determining whether there are severely distorted regions in all the geometric distortion-corrected images after the geometric distortion has been corrected for all of the images and replacing the pixel value in said severely distorted region with the pixel value in the corresponding region of other images.

The determination of whether there are severely distorted regions in all the geometric distortion-corrected images can be accomplished by, for each of the geometric distortion-corrected images calculating the image fidelity map according to the pixel shift map to make the image fidelity map reflects the shift and overlapping degree of pixels in the uniform phantom, and when the pixel value in some regions of said image fidelity map is larger than the threshold value, using this as an indication that there is a severely distorted region in the geometric distortion-corrected images.

The replacement of the pixel value in said severely distorted region with the pixel value in the corresponding region of other images can be accomplished by searching other images to check whether they have severely distorted pixels in the region corresponding to said severely distorted region; when there is only one image which is free of severely distorted pixels in the region corresponding to the severely distorted region, replacing the pixel value in the severely distorted region with the pixel value in the corresponding region of the image, and when there are multiple images which are free of severely distorted pixels in the region corresponding to the severely distorted region, combining the regions corresponding to said severely distorted region in said multiple images, and replacing the pixel value in the severely distorted region with the combined value.

The combination of all the geometric distortion-corrected images can be done by combining all the geometric distortion-corrected images in the image domain.

This combination of all the geometric distortion-corrected images can be done by converting all geometric distortion-corrected images into k-space data, combining the k-space data corresponding to all geometric distortion-corrected images, and converting the combined k-space data into a final image.

In order to achieve the aforesaid purposes, the present invention also encompasses a device for correcting distortion in MRI. This device includes an acquisition unit for collecting k-space data in a number of data readout directions and for converting the data into a number of images, a geometric distortion correction unit for creating the pixel shift map corresponding to each image, and for individually correcting the geometric distortion for all the images according to the pixel shift map, and an image combination unit for combining all the geometric distortion-corrected images.

The geometric distortion correction unit can include a pixel shift map generation module for creating a corresponding pixel shift map for each image, a geometric distortion correction module for calculating the shift position of every pixel in the image according to the corresponding pixel shift map, and for calculating the pixel value in the geometric distortion-corrected image based on the shift position and the pixel value in the shift position.

The device can further include a severely distorted region replacement unit, located between said geometric distortion correction unit and image combination unit, that determines whether there is a severely distorted region in all the geometric distortion-corrected images, and that replaces the pixel value in the severely distorted region with the pixel value in the corresponding region of other images.

The severely distorted region replacement unit can calculate the image fidelity map according to the corresponding pixel shift map for each of the geometric distortion-corrected images, this image fidelity map reflecting the shift and overlapping degree of pixels in the uniform phantom and, when the pixel value in some regions of said image fidelity map is larger than the threshold value, the severely distorted region replacement unit uses this as an indication that there is a severely distorted region in the geometric distortion-corrected images.

The severely distorted region replacement unit can search other images to check whether there are severely distorted pixels in the region corresponding to the severely distorted region and, when there is only one image which is free of severely distorted pixels in the region corresponding to the severely distorted region, this unit replaces the pixel value in the severely distorted region with the pixel value in the corresponding region of the image. When there are multiple images that are free of severely distorted pixels in the region corresponding to the severely distorted region, the regions corresponding to the severely distorted region in the multiple images are combined, and the pixel value in said severely distorted region is replaced by the combined value.

In this case, the image combination unit combines all the geometric distortion-corrected images in the image domain.

The image combination unit can convert all the geometric distortion-corrected images into k-space data, and combine a number of sets of the k-space data corresponding to all the geometric distortion-corrected images, and convert the combined k-space data into a final image.

In summary, in the present invention, the k-space data are acquired in a number of readout directions, and are converted into a number of images. A pixel shift map is created and the geometric distortion in a number of images is respectively corrected according to the pixel shift map. The multiple geometric distortion-corrected images are combined. Since the movement distortion normally exists in the data readout direction, the acquisition of the k-space data in a number of readout directions can effectively correct the movement distortion. Moreover, correcting the geometric distortion in the images converted from data acquired in a number of data readout directions according to the pixel shift map can reduce the geometric distortion of the final image created from the combined data. The solution of the present invention corrects not only the movement distortion of MRI images, but also the geometric distortion of the MRI images.

DESCRIPTION OF THE DRAWINGS

FIG. 4 is a schematic diagram of an acquisition of the k-space data in PROPELLER technology.

FIG. 5 is a schematic diagram of the blade rotation during data acquisition in the PROPELLER technology.

FIG. 6 is the schematic diagram of the shift and distortion of the pixel position caused by an inhomogeneous magnetic field.

FIG. 7 is a flowchart of the method for correcting distortion in MRI used in embodiment 2 according to the present invention.

FIG. 11 is a flowchart of a simulation of the present invention.

FIG. 12 is the original image of the created phantom.

FIG. 13 shows the distribution of inhomogeneous magnetic field used for distortion simulation.

DESCRIPTION OF THE PREFERRED EMBODIMENTS

In order to make the purposes, technical solutions and advantages of the present invention clearer and more understandable, the present invention is further described below in conjunction with figures and embodiments. It should be understood that, embodiments described herein are intended only for explaining the present invention, and not to limit the protective scope of the present invention.

Figure 1:
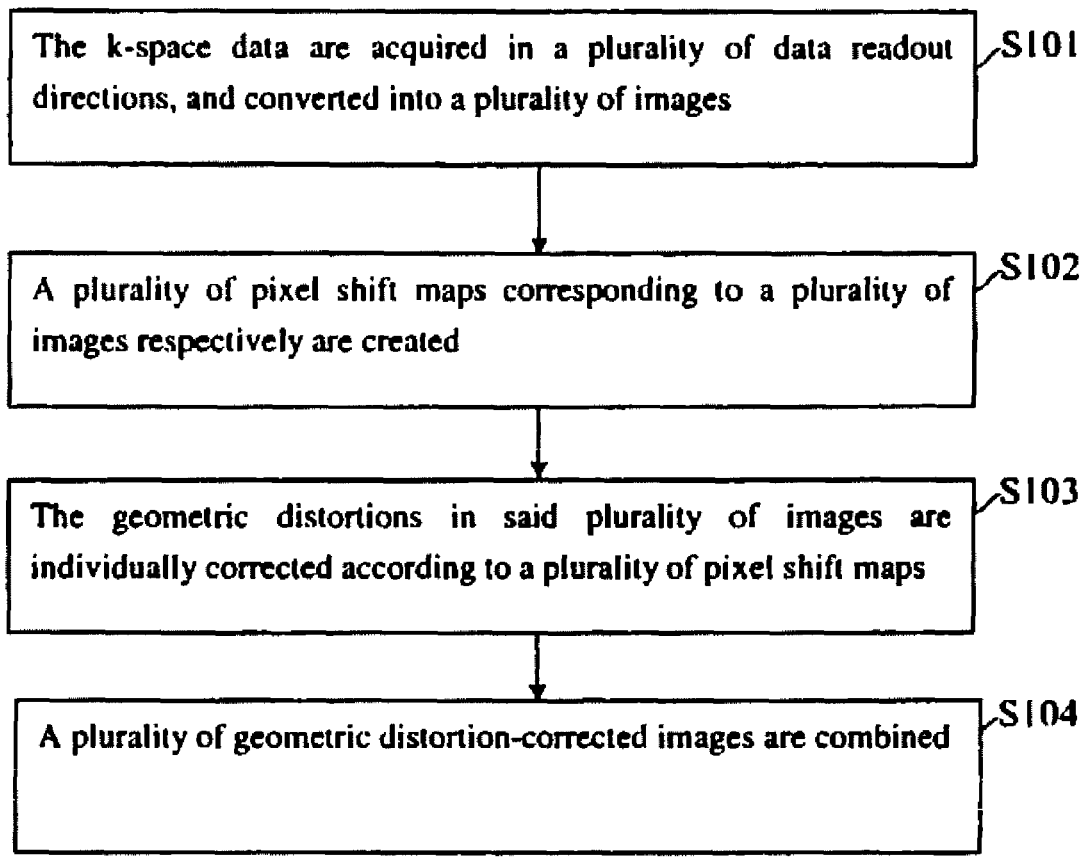
FIG. 1 is a flowchart of the method for correcting distortion in MRI according to the present invention.

FIG. 1 is a flowchart of the method for correcting distortion in MRI according to the present invention. As shown in FIG. 1, in step S101, k-space data are acquired in a number of data readout directions, and converted into a number of images; in step S102, a number of pixel shift maps corresponding to a number of images are respectively created; in step S103, the geometric distortions in a number of images are respectively corrected according to a number of pixel shift maps; in step S104, a number of geometric distortion-corrected images are combined.

The present invention is described in detail below through several embodiments.

Figure 2:
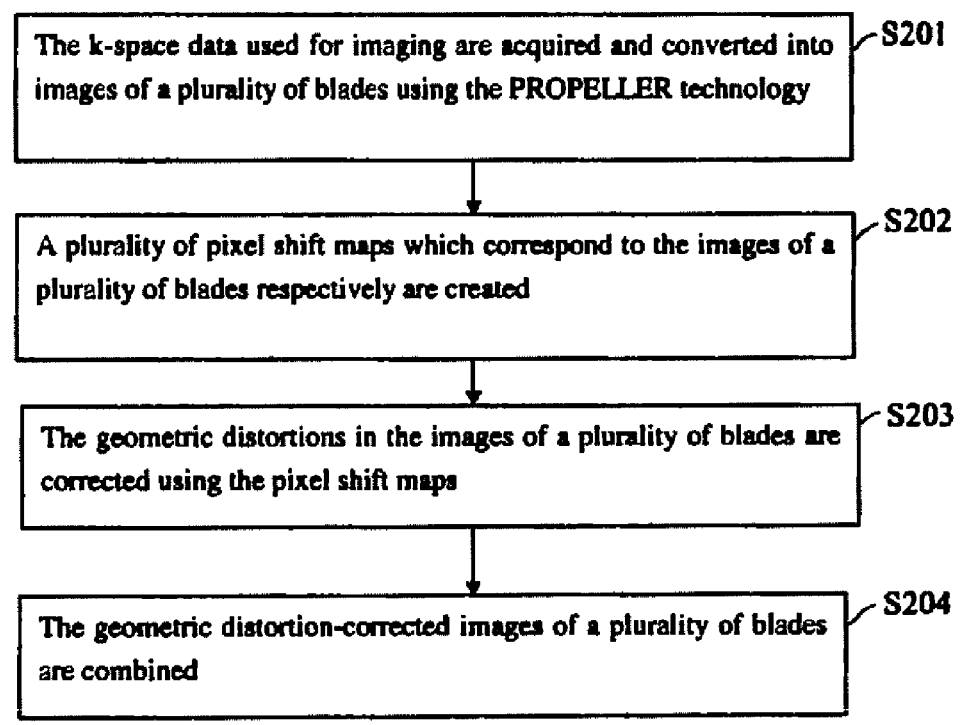
FIG. 2 is a flowchart of the method for correcting distortion in MRI in embodiment 1 according to the present invention.

FIG. 2 is a flowchart of the method for correcting distortion in MRI used in embodiment 1 according to the present invention. As shown in FIG. 2, the correction of distortions in MRI mainly includes the following step:

step S201, that is, the PROPELLER technology is used to acquire the k-space data for imaging and converting the data into a number of images.

For a Turbo Spin Echo (TSE) sequence, since distortion only occurs in the data readout (RO) directions, if an imaging method uses one single RO direction, it will be difficult to recover these overlapping signals. The present invention employs the PROPELLER acquisition technology and can acquire data in a number of RO directions.

Figure 3:
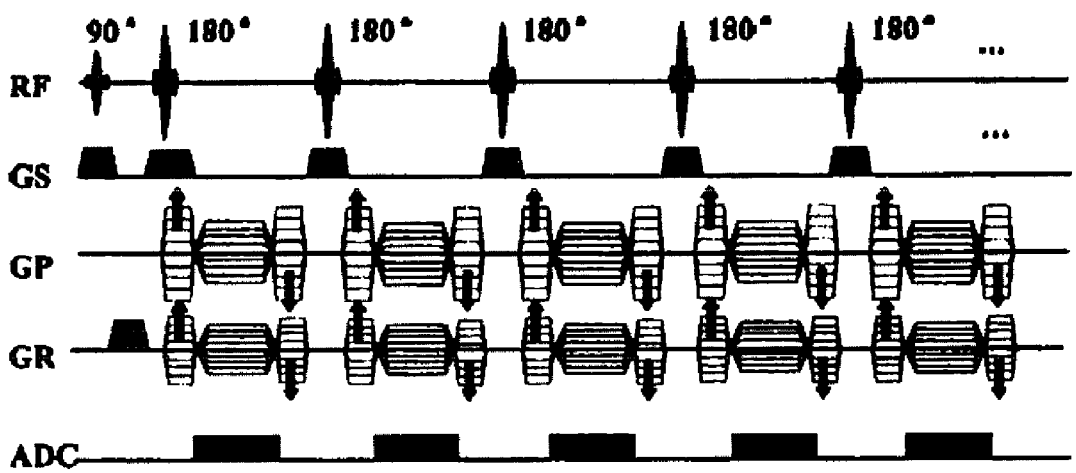
FIG. 3 is a schematic diagram of the TSE-based sequence in an echo train used in the PROPELLER technology.

FIG. 3 is a schematic diagram of the TSE-based sequence in an echo train used in the PROPELLER technology. As shown in FIG. 3, in this embodiment, the traditional readout gradient and phase encoding gradient are combined to achieve the rotation of the actual encoding direction while data of different blades are being acquired. FIG. 4 is a schematic diagram of an acquisition of the k-space data used in the PROPELLER technology. As shown in FIG. 4, the L phase encoding lines are acquired in the center of the k-space in one data acquisition. These lines form a blade, the width of which is the phase constant for one acquisition, i.e. the echo train length. The value of the width of the blade, L, can be freely set.

After the data of a blade are scanned and acquired, the blade rotates. FIG. 5 is a schematic diagram of the blade rotation during data acquisition of the PROPELLER technology according to the embodiment. As shown in FIG. 5, the initial RO direction coincides with the x-coordinate, after data acquisition of a blade, the ranges of the traditional readout gradient and phase encoding gradient are adjusted to rotate the effective RO direction with an angle of θ to a new direction a(n+1) for acquiring data of another blade. In this case, θ can be freely set. Normally, the greater the inhomogeneity of the magnetic field, the smaller the value of θ. The RO direction is continuously rotated in the same manner until all blades basically cover the whole k-space, i.e. k-space is completely filled. The size of the entirety of k-space is determined by the desired field of vision (FOV) and space resolution.

After data acquisition has finished, data of all blades are converted into a number of images for post-processing.

In step S202, a number of pixel shift maps, $I_{\Delta x}$, are created.

The pixel shift map, $I_{\Delta x}$, indicates the distance of signal shift caused by inhomogeneity of the magnetic field. The pixel shift map, $I_{\Delta x}$, shows an inverse linear relationship with the magnetic field inhomogeneity map, $\Delta B(x,y)$. For example, using gradient echo sequence (GRE) to calculate the phase difference between two images with different echo times (TE), said phase difference can reflect the magnetic map, $\Delta B(x,y)$, and the pixel shift map, $I_{\Delta x}$, is calculated according to formula (1).

$$I_{\Delta x}(x, y) = \frac{\Delta B(x, y) * N_{RO}}{G_{ro} * L_{ro}} \quad (1)$$

In this case, Δx is the shift distance of the pixel in the RO direction; $N_{ro}$ indicates the dimensions of the image matrix in RO direction; $G_{ro}$ indicates the range of the RO gradient; $L_{ro}$ indicates the FOV in the RO direction. Other methods can also be used for calculating the measurement of the pixel shift map.

In step S203, the pixel shift map is used for correcting geometric distortion.

FIG. 6 is a schematic diagram of the shift and distortion of the pixel position caused by inhomogeneity of the magnetic field. As shown in FIG. 6, if the primary magnetic field is homogeneous in the RO direction, the signal between the position $X_{n+1}$ and position $X_{n+2}$ forms the pixel $P_{n+1}$ in the reconstructed image after Fourier transform. Due to the inhomogeneity of the magnetic field, the position $X_{n+1}$ is shifted to the position $X_{n+1'}$, the position $X_{n+2}$ is shifted to the position $X_{n+2'}$. Therefore, part of the signals in $P_{n+1}$ are actually shifted to the pixel $P_{m+1}$, and other signals of $P_{n+1}$ are shifted to $P_{m+2}$ in the reconstructed image after Fourier transform. Here, the position $X_{n+1'}$ and the position $X_{n+2'}$ can be calculated according to the pixel shift map.

Next, a possible method for correcting distortion using a pixel shift map is introduced. In order to recover the pixel $P_{n+1}$, first $X_{n+1'}$ and $X_{n+2'}$ are calculated according to the pixel shift map, $I_{\Delta x}$, and then calculation according to formula (2), $$P_{n+1} = \frac{X_{m+2} - X'_{n+1}}{X_{m+2} - X_{m+1}} . P_{m+1} + \frac{X'_{n+2} - X_{m+2}}{X_{m+3} - X_{m+2}} . P_{m+2} \quad (2)$$

wherein, $P_{m+1}$ and $P_{m+2}$ are pixels in the image after direct inverse Fourier transform.

All pixels are corrected in the same manner. All blades are corrected prior to the next processing.

In step S204, data of all blades are combined to form the final image.

As to the specific combination method, data may be combined directly in the image space to obtain the final image. Alternatively, data may be combined in k-space and then converted into the image space to obtain the final image. If data are combined in the k-space, data of all blades are converted into k-space, and these data are re-gridded into a Cartesian coordinate system to form completely fill k-space, and then the final image is obtained through inverse Fourier transform.

FIG. 7 is a flowchart of the method for correcting distortion in MRI used in embodiment 2 according to the present invention. The difference between this embodiment and embodiment 1 is that, at the data post-processing stage of this embodiment, the recovery processing of severely distorted regions is added to further enhance the performance of the geometric distortion correction to obtain better image quality. As shown in FIG. 7, in this embodiment, the distortion correction process mainly includes the following steps:

step S701, that is, the PROPELLER technology is used to acquire the k-space data for imaging and convert the data into a number of images.

Step S702, that is, a number of pixel shift maps $I_{\Delta x}$ are created.

In step S703, the pixel shift map is used for correcting geometric distortion of a number of images.

The processing method used in the aforesaid steps S701 to S703 is the same or similar to those in steps S201 to S203 of embodiment 1.

In step S704, the severely distorted regions in the data of each blade are determined.

The image fidelity map, $I_f$, is calculated according to the pixel shift map $I_{\Delta x}$. The specific method can be as follows:

Firstly, supposing a uniform phantom is set, i.e., a phantom in which all pixels have the same value, under the same inhomogeneity degree of the magnetic field, $B_\Delta$, and then the distorted images in the RO direction of all blades are calculated. Among these distorted images, the greater the pixel value, the more overlapping signals there are.

Secondly, the sources of these overlapping images are calculated, and the values of distorted pixels are used in these positions to form the fidelity maps of all blades. For example, supposing three pixels, $P_i=1$, $P_{i+1}=1$, $P_{i+2}=1$, in a uniform phantom are shifted and overlapped to the pixel, $P_k=3$, in the distorted image, and the three positions in the fidelity map $I_f$ are then set with the value of $P_k$ in the distorted image. In this way, a series of fidelity maps, $I_{f1}, I_{f2}, \ldots$, can be calculated for all blades. Therefore, the image fidelity map reflects the degree of pixel shift and overlapping of the uniform phantom.

Thirdly, a threshold value is set, and regions in various fidelity maps with a value which is larger than the threshold value are indicated as the severely distorted regions of various blades.

In step S705, the severely distorted regions in each blade are recovered.

For each blade, if there is a severely distorted region, pixels in the severely distorted region are replaced by the corresponding pixels in the same region of other blades.

The specific method may be as follows: searching images of other blades to check whether they have severely distorted pixels in the region corresponding to the severely distorted region; when there is only one image which is free of severely distorted pixels in the region corresponding to the severely distorted region, the pixel value in the severely distorted region is replaced by the pixel value in the corresponding region of the image; when there are multiple images which are free of severely distorted pixels in the region corresponding to the severely distorted region, the regions corresponding to said severely distorted region in said multiple images are combined, and the pixel value in the severely distorted region is replaced by the combined value.

In step S706, data of all blades are combined to obtain the final image. The processing method used in this step may be the same or similar to those in step S204 of the embodiment.

The present invention further provides a device corresponding to the aforesaid method for correcting distortion in MRI.

Figure 8:
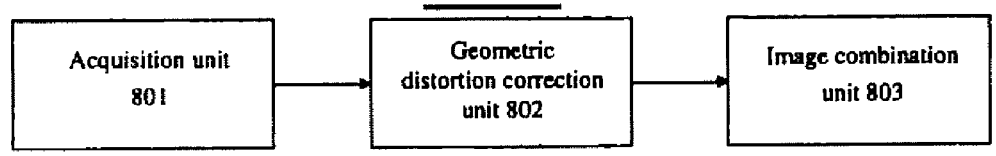
FIG. 8 is a diagram showing the structure of the device for correcting distortion in MRI used in embodiment 3 according to the present invention.

FIG. 8 shows the structure of the device for correcting distortion in MRI used in embodiment 3 according to the present invention. As shown in FIG. 8, said device comprises: an acquisition unit 801, a geometric distortion correction unit 802 and an image combination unit 803. In this case, the acquisition unit 801 acquires k-space data in a number of data readout directions and converts the data into a number of images; the geometric distortion correction unit 802 respectively creates a number of pixel shift maps corresponding to a number of images, and respectively corrects the geometric distortion in a number of images according to a number of pixel shift maps; the image combination unit 803 combines a number of geometric distortion-corrected images.

The geometric distortion correction unit 802 has a pixel shift map generation module 8021 and a geometric distortion correction module 8022. In this case, the pixel shift map generation module 8021 creates a number of pixel shift maps respectively corresponding to a number of images. The geometric distortion correction module 8022 calculates the shift position of every pixel for each of a number of images according to the corresponding pixel shift map, and calculates the pixel value in the geometric distortion-corrected image based on the shift position and the pixel value in the shift position.

The image combination unit 803 combines a number of geometric distortion-corrected images in the image domain. Alternatively, the image combination unit 803 converts a number of geometric distortion-corrected images into k-space, data and combines a number of the set of k-space data corresponding to a number of geometric distortion-corrected images, and then converts the combined k-space data into a final image.

Figure 9:
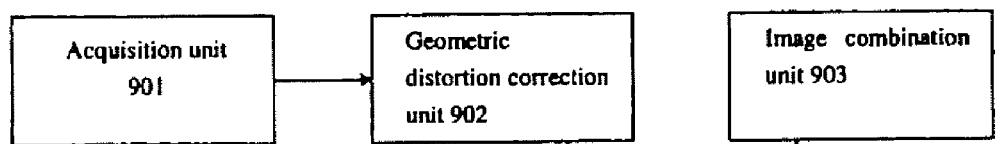
FIG. 9 is a diagram illustrating the structure of the device for correcting distortion in MRI used in embodiment 4 according to the present invention.

FIG. 9 shows the structure of the device for correcting distortion in MRI used in embodiment 4 according to the present invention. As shown in FIG. 9, this device has an acquisition unit 901, a geometric distortion correction unit 902, an image combination unit 903 and a severely distorted region replacement unit 904. In this case, the acquisition unit 901, geometric distortion correction unit 902 and image combination unit 903 have the same functions as that of the acquisition unit 801, geometric distortion correction unit 802 and image combination unit 803, respectively.

The severely distorted region replacement unit 904, located between the geometric distortion correction unit 902 and the image combination unit 903, determines whether there is a severely distorted region in the number of geometric distortion-corrected images, and replaces the pixel value in the severely distorted region with the pixel value in the corresponding region of other images from a number of images.

The severely distorted region replacement unit 904 calculates the image fidelity map for each of a number of geometric distortion-corrected images according to a corresponding pixel shift map, and the image fidelity map reflects the shift and overlapping degree of pixels in the uniform phantom; if the pixel value in some regions of the image fidelity map is larger than the threshold value, it is determined that there is a severely distorted region in the geometric distortion-corrected images.

Specifically, the severely distorted region replacement unit 904 searches the same regions of other images to check whether they have severely distorted pixels; when there is only one image which is free of severely distorted pixels in the region corresponding to the severely distorted region, it replaces the pixel value in the severely distorted region with the pixel value in the corresponding region of the image; when there are multiple images which are free of severely distorted pixels in the region corresponding to the severely distorted region, it combines the regions corresponding to the severely distorted region in said multiple images, and replaces the pixel value in the severely distorted region with the combined value.

The aforesaid method and device can be used to combine the movement correction with the geometric distortion correction. During the prolonged scanning process, patients may become impatient and may move their bodies. The PROPELLER-based technology can correct this kind of artifact to provide better image quality because; in the case of the technical solution of single RO gradient direction, the fidelity of the recovered images will be greatly reduced if there is severe overlapping in the distorted images but, in the PROPELLER-based acquisition solution, data are acquired from different RO directions where the severely distorted position in one blade may not exist in other blades because different RO directions cause different distortion modes, thus choosing signals from all blades and combining all the blades would provide better recovered images. Moreover, in the method and device according to the present invention, the geometric distortions of various blades are corrected to further improve the quality of images when factors such as an inhomogeneous magnetic field that cause geometric distortion exist. In the method according to the present invention, the movement distortion is corrected independently of correction of the geometric distortion without mutual interference so that the effect of the geometric distortion correction does not influence the effect of the movement distortion correction.

Figure 10:
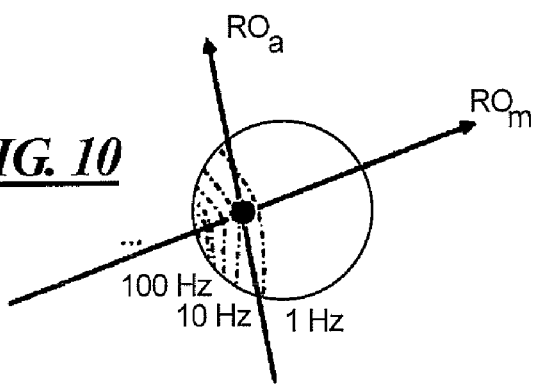
FIG. 10 is a schematic diagram of different overlapping modes caused by different RO directions.

FIG. 10 shows the schematic diagram of different overlapping modes caused by different RO directions. As shown in FIG. 10, supposing the shaded area is the interested area, and for the shaded area, the variation of the magnetic field in the direction of $RO_m$ is larger than in the direction of $RO_n$, if the RO direction is in the direction of $RO_m$ and its polarity is not properly set, severe overlapping will occur in the reconstructed images after direct inverse Fourier transform. However, this kind of overlapping does not occur in the direction of $RO_n$. Therefore, we can use the blade $RO_n$, rather than the $RO_m$ to initially recover the information of the shaded area.

The following is the simulation results using the MATLAB software to highlight the advantages of the present invention.

FIG. 11 is a flowchart of a simulation of the present invention. As shown in FIG. 11, the simulation is conducted as follows:

In step. S1101, the phantom and the distribution diagram of the inhomogeneous magnetic field are created.

FIG. 12 is the original image of the created phantom with a resolution of 256×256. FIG. 13 shows the distribution diagram of the inhomogeneous magnetic field used for distortion simulation. The distribution diagram of the inhomogeneous magnetic field shown in FIG. 13 is normalized to allow one unit to correspond to the shift of one pixel. The pixel shift map can be calculated according to the distribution diagram of the inhomogeneous magnetic field.

In step 1102, the polarity of RO is determined and the PROPELLER acquisition process is simulated.

Figure 14:
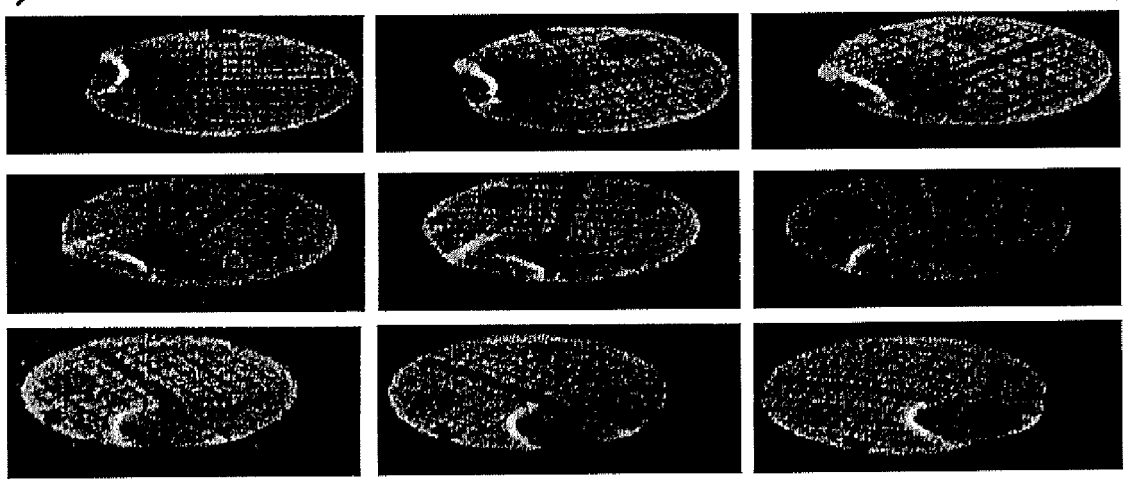
FIG. 14 shows the distorted images of all blades after conducting direct inverse Fourier transform on the simulated original data of the TSE-based sequence.

The acquisition solution used for the simulation is: 9 blades, 64 PE lines per blade, the increment of rotation angle in the direction of RO gradient is $\pi/9$. FIG. 14 shows the distorted images of all blades after direct inverse Fourier transform of the simulated original data of the TSE-based sequence.

In step 1103, the magnetic field map is used for distortion correction.

Figure 15:
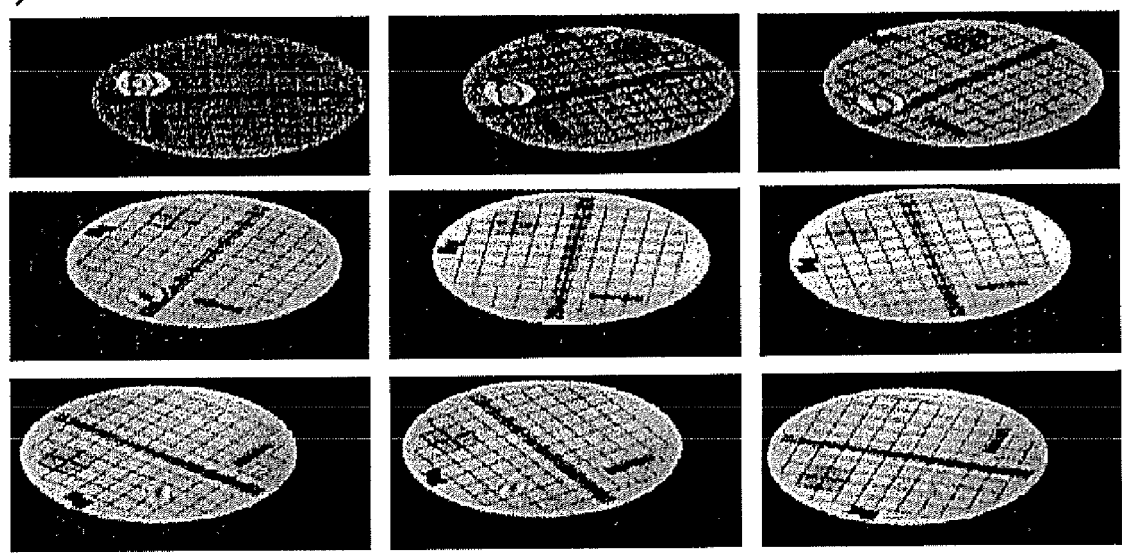
FIG. 15 shows the images of all blades which have finished the distortion correction using the magnetic field map.

FIG. 15 shows the images of all blades which have finished distortion correction using the magnetic field map.

In step 1104, the severely distorted regions are recovered.

Figure 16:
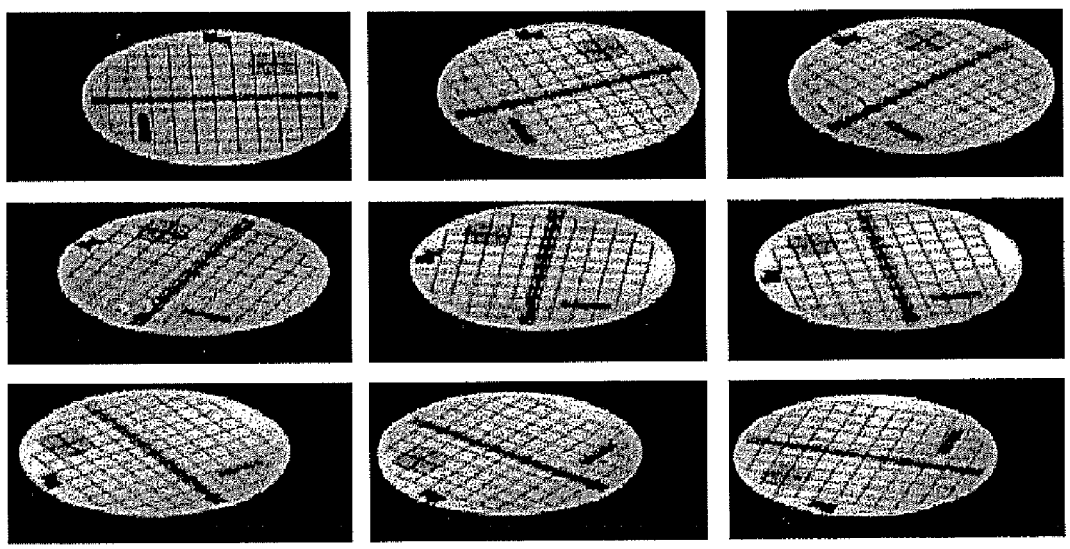
FIG. 16 shows the images of repairing severely distorted regions in all blades according to the fidelity map.

FIG. 16 shows the images of repairing severely distorted regions in all blades according to the fidelity map.

In step 1105, data of all blades are combined to form the final image.

Figure 17:
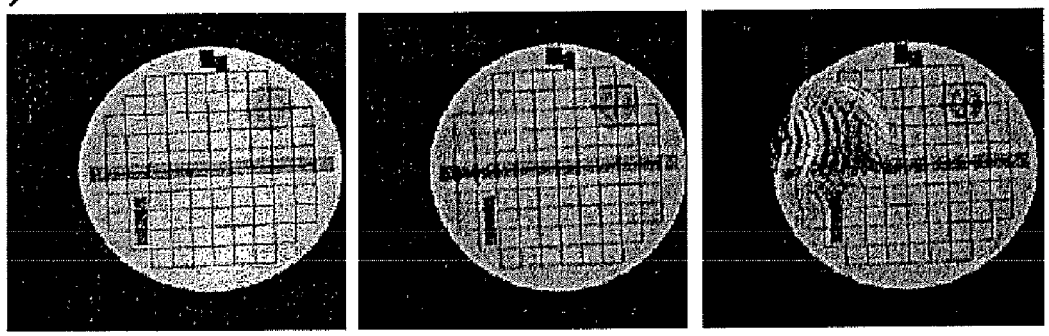
FIG. 17 is a schematic comparison diagram of the original image without distortion, the image which is acquired by PROPELLER technology and is corrected, and the image which is acquired by PROPELLER technology and is not corrected.

FIG. 17 is a schematic diagram showing the comparison of the original image without distortion, the corrected image acquired by the PROPELLER technology, and the uncorrected image acquired by PROPELLER technology. In FIG. 17, to the left is the original image without distortion, in the middle is the image acquired by the PROPELLER technology with geometric distortion correction, and to the right is the image acquired by the PROPELLER technology without geometric distortion correction. As shown in FIG. 16, the quality of the images is greatly improved with geometric distortion correction after acquisition using the PROPELLER technology when compared to the image without geometric distortion correction. This indicates that the method and device according to the present invention can effectively improve the problems of geometric distortion in images acquired by the PROPELLER technology. Therefore, the method and device according to the present invention can not only effectively correct the movement distortion in MRI, but also effectively correct the geometric distortion.

The present invention can be applied not only in the PROPELLER-based technology as shown in the aforesaid embodiments, but can also be used in another technology which acquires data in a number of RO directions.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting distortion in magnetic resonance imaging, comprising the steps of:
   acquiring k-space data in a plurality of data readout directions, and converting the k-space data into a plurality of images, each comprised of pixels, with each pixel having a pixel value, and at least some of said images exhibiting geometric distortion;
   creating a pixel shift map for each of said images;
   correcting the geometric distortion in respective images in said plurality of images that exhibit geometric distortion, according to the respective phase shift map created for each respective image exhibiting geometric distortion, thereby obtaining geometric distortion-corrected images; and
   combining all of said geometric distortion-corrected images.

2. A method as claimed in claim 1 comprising correcting the respective images exhibiting geometric distortion according to the respective pixel shift map by:
   calculating a shift position of every pixel in the respective images exhibiting geometric distortion, according to the pixel shift map created for the respective image exhibiting geometric distortion; and
   calculating the respective pixel values for pixels in the geometric distortion-corrected images according to the shift position and the pixel value in the shift position.

3. The method as claimed in claim 1, further comprising:
   determining whether there are severely distorted images in any of the geometric distortion-corrected images after the geometric distortion has been corrected for all of said images exhibiting geometric distortion; and
   in a geometric distortion corrected image that is determined to have a severely distorted region therein, replacing at least one pixel value in the severely distorted region therein with at least one pixel value of a corresponding region of another of said plurality of geometric distortion-corrected images.

4. The method as claimed in claim 3 comprising determining whether there are severely distorted regions in any of the geometric distortion-corrected images by:
   for each of the geometric distortion-corrected images, calculating an image fidelity map according to the pixel shift map for the respective distortion-corrected image, said image fidelity map reflecting a shift and overlapping degree of the pixels in a uniform phantom, said image fidelity map also being comprised of pixels; and
   when a pixel value of a pixel in at least one region of said image fidelity map is larger than a threshold value, determining that there is a severely distorted region in the geometric distortion-corrected image from which the image fidelity map, that contains the pixel value that exceeds said threshold, was calculated.

5. The method as claimed in claim 3, wherein said geometric distortion-corrected image that is determined to have said severely distorted region is an image in need of further correction, and wherein said replacement of the pixel value in said severely distorted region in said image in need of further correction with a pixel value in the corresponding region of said another of said distortion-corrected images comprises:
   searching among said distortion-corrected images, other than said image in need of further correction, to check whether any have severely distorted pixels in a region corresponding to said severely distorted region of said image in need of further correction;
   when there is only one image among the searched images that is free of severely distorted pixels in the region corresponding to the severely distorted region in the image in need of further correction, replacing said pixel value in the severely distorted region in the image in need of further correction with a pixel value in a corresponding region of said only one image; and
   when there are multiple images among the searched images that are free of severely distorted pixels in a region corresponding to the severely distorted region in the image in need of further correction, combining regions, respectively in said multiple images, corresponding to said severely distorted region in said image in need of further correction, and replacing said pixel value in said severely distorted region in said image in need of further correction with a combined pixel value derived from the combined multiple images.

6. The method as claimed in claim 1 comprising combining all of the distortion-corrected images in the image domain.

7. The method as claimed in claim 1 comprising combining all of said distortion-corrected images by:
   converting each of said distortion-corrected images into a k-space data set;

combining the respective k-space data sets corresponding to the geometric distortion-corrected images, thereby obtaining a combined k-space data set; and converting the combined k-space data set into a final image.

8. An apparatus for correcting distortion in magnetic resonance imaging, comprising:

a magnetic resonance data acquisition device configured to acquire k-space data in a plurality of data readout directions, and to convert the k-space data into a plurality of images, each comprised of pixels, with each pixel having a pixel value, and at least some of said images exhibiting geometric distortion;

a processor configured to create a pixel shift map for each of said images;

said processor being configured to correct the geometric distortion in respective images in said plurality of images that exhibit geometric distortion, according to the respective phase shift map created for each respective image exhibiting geometric distortion, thereby obtaining geometric distortion-corrected images; and said processor being configured to combine all of said geometric distortion-corrected images.

9. The apparatus as claimed in claim 8, wherein said processor being configured to correct the respective images exhibiting geometric distortion according to the respective pixel shift map by:

calculating a shift position of every pixel in the respective images exhibiting geometric distortion, according to the pixel shift map created for the respective image exhibiting geometric distortion; and calculating the respective pixel values for pixels in the geometric distortion-corrected images according to the shift position and the pixel value in the shift position.

10. The apparatus as claimed in claim 8, wherein said processor being configured to:

determine whether there are severely distorted images in any of the geometric distortion-corrected images after the geometric distortion has been corrected for all of said images exhibiting geometric distortion; and in a geometric distortion corrected image that is determined to have a severely distorted region therein, replace at least one pixel value in the severely distorted region therein with at least one pixel value of a corresponding region of another of said plurality of geometric distortion-corrected images.

11. The apparatus as claimed in claim 10, wherein said processor being configured to determine whether there are severely distorted regions in any of the geometric distortion-corrected images by:

for each of the geometric distortion-corrected images, calculating an image fidelity map according to the pixel shift map for the respective distortion-corrected image, said image fidelity map reflecting a shift and overlapping degree of the pixels in a uniform phantom, said image fidelity map also being comprised of pixels; and when a pixel value of a pixel in at least one region of said image fidelity map is larger than a threshold value, determining that there is a severely distorted region in the geometric distortion-corrected image from which the image fidelity map, that contains the pixel value that exceeds said threshold, was calculated.

12. The apparatus as claimed in claim 10, wherein said geometric distortion-corrected image that is determined to have said severely distorted region is an image in need of further correction, and wherein said processor being configured to replace the pixel value in said severely distorted region in said image in need of further correction with a pixel value in the corresponding region of said another of said distortion-corrected images by:

searching among said distortion-corrected images, other than said image in need of further correction, to check whether any have severely distorted pixels in a region corresponding to said severely distorted region of said image in need of further correction;

when there is only one image among the searched images that is free of severely distorted pixels in the region corresponding to the severely distorted region in the image in need of further correction, replacing said pixel value in the severely distorted region in the image in need of further correction with a pixel value in a corresponding region of said only one image; and when there are multiple images among the searched images that are free of severely distorted pixels in a region corresponding to the severely distorted region in the image in need of further correction, combining regions, respectively in said multiple images, corresponding to said severely distorted region in said image in need of further correction, and replacing said pixel value in said severely distorted region in said image in need of further correction with a combined pixel value derived from the combined multiple images.

13. The apparatus as claimed in claim 8, wherein said processor being configured to combine all of the distortion-corrected images in the image domain.

14. The device as claimed in claim 8, wherein said processor being configured to combine all of said distortion-corrected images by:

converting each of said distortion-corrected images into a k-space data set;

combining the respective k-space data sets corresponding to the geometric distortion-corrected images, thereby obtaining a combined k-space data set; and converting the combined k-space data set into a final image.

* * * * *